United States Patent
Kuroda et al.

(10) Patent No.: US 7,375,958 B2
(45) Date of Patent: May 20, 2008

(54) CARD ADAPTOR

(75) Inventors: Yoshimasa Kuroda, Miyagi-ken (JP); Yuichiro Ikeda, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 407 days.

(21) Appl. No.: 11/058,997

(22) Filed: Feb. 15, 2005

(65) Prior Publication Data
US 2005/0185371 A1 Aug. 25, 2005

(30) Foreign Application Priority Data

| Feb. 24, 2004 | (JP) | .............................. | 2004-047952 |
| Feb. 24, 2004 | (JP) | .............................. | 2004-047957 |

(51) Int. Cl.
H05K 5/00 (2006.01)
H05K 7/00 (2006.01)
G06F 1/16 (2006.01)
H01R 24/00 (2006.01)

(52) U.S. Cl. ...................... 361/684; 361/685; 361/686; 439/630; 439/632

(58) Field of Classification Search ........ 361/683–686; 439/630, 629, 632
See application file for complete search history.

(56) References Cited

U.S. PATENT DOCUMENTS

| 6,224,391 | B1 * | 5/2001 | Horie et al. ................... 439/64 |
| 6,264,506 | B1 | 7/2001 | Yasufuku et al. |
| 6,408,352 | B1 | 6/2002 | Hosaka et al. |
| 6,547,603 | B1 | 4/2003 | Yu |
| 7,094,106 | B2 * | 8/2006 | Yamamoto et al. ......... 439/630 |
| 2002/0101722 | A1 * | 8/2002 | Oguchi et al. ............... 361/728 |
| 2003/0013334 | A1 * | 1/2003 | Kuroda ........................ 439/159 |
| 2003/0013336 | A1 * | 1/2003 | Kuroda ........................ 439/218 |
| 2003/0024983 | A1 * | 2/2003 | Yeh .............................. 235/441 |
| 2003/0032317 | A1 * | 2/2003 | Ooya et al. .................. 439/159 |
| 2004/0009708 | A1 * | 1/2004 | Gochnour et al. ........... 439/638 |

FOREIGN PATENT DOCUMENTS

| JP | S61-20185 | 1/1986 |
| JP | 2000-040131 | 2/2000 |
| JP | 2001-209773 | 3/2001 |
| JP | 2002-157056 | 5/2002 |
| JP | 2004-047952 | 2/2006 |

OTHER PUBLICATIONS

Hiroki Aida, Tomonori Shindou, "Blooming Next-Generation Mobile Phone—'1M mega-pixel', 'Linux', just to name a few", Nikkei Electronics, Japan, Nikkei Business Publications Inc., Mar. 31, 2003, Issue No. 844, pp. 57-68.

* cited by examiner

Primary Examiner—Lisa Lea-Edmonds
Assistant Examiner—Anthony M Haughton
(74) Attorney, Agent, or Firm—Beyer Law Group LLP

(57) ABSTRACT

A plurality of specific external connecting parts can be short-circuited, without increasing the number of parts and mounting work. A plurality of external connecting parts provided in parallel to each other, and a short-circuit part for short-circuiting edges located at rear end side of each of a first external connecting part and a second external connecting part which separate external connecting parts not short-circuited among the external connecting parts are inserted therebetween are comprised. The short-circuit part is formed by upward or downward bending process, and has a curved part.

8 Claims, 4 Drawing Sheets

CARD ADAPTOR

BACKGROUND OF THE INVENTION

1. Field of the Invention

The present invention relates to a card adaptor for connecting a small card mounted in a card mounting part to a card connector device.

2. Description of the Related Art

Such conventional techniques are shown in Japanese unexamined Patent Application Publication Nos. 2000-40131, 2000-305662, 2002-157056, and 2003-150912 and Japanese examined Patent Application Publication No. 3250986. In these conventional techniques, a plurality of external connecting parts which are provided in parallel to each other and are connected to a card connector device are provided, and a card mounting part for mounting a card inside of a case forming a main body is provided and is connected to the card connector device in a state that the card is mounted in the card mounting part. Thereby, the signal transmission/reception between the card and the card connector device is possible.

In the above-mentioned card connector device, a standard card having a dimension larger than that of a card mounted in the card adaptor can be mounted. In addition, the above-mentioned conventional card adaptor is set to have a dimension approximately equal to that of the standard card. Also, the above-mentioned standard card comprises a plurality of external connecting parts connected to a card connector device, but a plurality of specific external connecting parts among the plurality of external connecting parts are short-circuited according to standard requirements.

The above-mentioned case is constructed by engaging an upper case member and a lower case member to each other and integrally forming them by a coupling part.

In conventional card adaptors, it is not considered that a plurality of specific external connecting parts among a plurality of external connecting parts are short-circuited to each other.

Since a plurality of external connecting parts of the card adaptor are provided in parallel to each other on the same plane, in the case that the specific external connecting parts among the plurality of external connecting parts are short-circuited to each other, a structure may be considered that a conducting member extending to at least one external connecting part which is not short-circuited is separately provided, and the conducting member is connected to each of the plurality of specific external connecting parts.

However, in the case of separately providing a conducting member, the number of parts is increased and a mounting work for connecting the conducting member to each of the plurality of external connecting parts is needed. As a result, there is a problem in that the number of mounting work is increased and consequently the manufacturing cost is also increased.

Furthermore, in the above-mentioned card adaptor, if the card is distorted by a mistake when mounting the card in the card mounting part, a force is delivered to an engaging part between the upper case member and the lower case member. As a result, there is a problem in that the case may be damaged.

SUMMARY OF THE INVENTION

In view of the above-mentioned problems, it is an object of the present invention to provide a card adaptor which can short-circuit a plurality of specific external connecting parts without increasing the number of parts and mounting work.

In addition, it is another object of the present invention to provide a card adaptor, in which a force generated when a card is distorted by a mistake upon mounting the card therein is prevented from being delivered to an engaging part between an upper case member and a lower case member.

In order to achieve the above-mentioned object, a card adaptor according to the present invention comprises a plurality of external connecting parts provided in parallel to each other, and a short-circuit part for short-circuiting edges located at rear end side of each of a plurality of specific external connecting parts which at least one external connecting part is inserted therebetween.

In the present invention, a short-circuit part is formed at edges located at a rear end side of each of a plurality of specific external connecting parts, and the short-circuit part can be integrally formed simultaneously with the specific external connecting part in the process of manufacturing the external connecting part. Accordingly, the plurality of specific external connecting parts can be short-circuited by the short-circuit part formed at the above-mentioned edge, without increasing the number of parts and mounting work.

In addition, in the present invention, the short-circuit part is formed by upward or downward bending process. In the present invention as described above, since a short-circuit part is bent upward or downward, the longitudinal dimension can be shorten.

Furthermore, in the present invention, a length from a predetermined reference line extending in parallel to a rear end side of a case to the edges of specific external connecting parts are set to be different from each other, and a curved part is formed at the short-circuit part. In the present invention having such structure, variation of a short-circuit part caused by a relationship between a short-circuit part for connecting the plurality of specific external connecting parts formed by a bending process and a different length can be absorbed into variation of the curved part.

Also, in the present invention, a case having an upper case member and a lower case member engaged to each other is further comprised, a card mounting part is formed at a space between the upper case member and the upper case member, and a card guide for guiding either a top surface or a bottom surface of a card mounted in a card mounting part to either the upper case member and the lower case member is further comprised.

In the present invention having such structure, if a card is distorted by a mistake when a card is mounted in a card mounting part, the card guide is subject to the force and thus the force due to a distortion of the card is not delivered to an engaging part between the upper case member and the lower case member.

Moreover, in the present invention, an escaping part for escaping from the card guide is formed at any one of the upper case member and the lower case member which does not have a card guide. In the present invention having such structure, a top surface of a card guide and a top surface of the other member can be set at one surface.

Also, in the present invention, a front wall located at a front end side in a vicinity of an inserting groove of a card and a rear wall located at a rear end side thereof are formed at either the upper case member or the lower case member, and the other member of the upper case member and the lower case member is positioned between the front wall and the rear wall.

In the present invention having such structure, since the other member of the upper case member and the lower case member is not protruded to the outside of longitudinal direction of the other member having the front wall and the rear wall, the length can be determined when manufacturing the other member. Therefore, it is possible to avoid deviation of the longitudinal dimension of a product by precisely manufacturing the other member.

Since the present invention comprises a short-circuit part for short-circuiting edges located at a rear end sides of each of the plurality of specific external connecting parts, the plurality of specific external connecting parts can be short-circuited without increasing the number of parts and mounting work, thereby suppressing the manufacturing cost.

Also, in the present invention, since a card guide can absorb a force generated when a card is distorted by a mistake upon mounting the card, the force due to the distortion of the card is not delivered to an engaging part between the upper case member and the lower case member, and thus the case is prevented from being broken. As a result, a stronger card mounting structure than the previous one can be accomplished and an excellent durability can be obtained.

BRIEF DESCRIPTION OF THE DRAWINGS

FIGS. 1A to 1C show an embodiment of a card adaptor according to the present invention, wherein FIG. 1A is a plan view of a portion of an upper case member, FIG. 1B is a front view thereof, and FIG. 1C is an enlarged view of a major part viewed at the direction A in FIG. 1A.

FIGS. 2A and 2B show a lower case member included in the present embodiment, wherein FIG. 2A is a plan view thereof and FIG. 2B is a front view of a vicinity of the front end side.

DESCRIPTION OF THE PREFERRED EMBODIMENT

Hereinafter, a preferred embodiment for embodying a card adaptor related to the present invention will now be described with reference to the drawings.

Figure 1A:
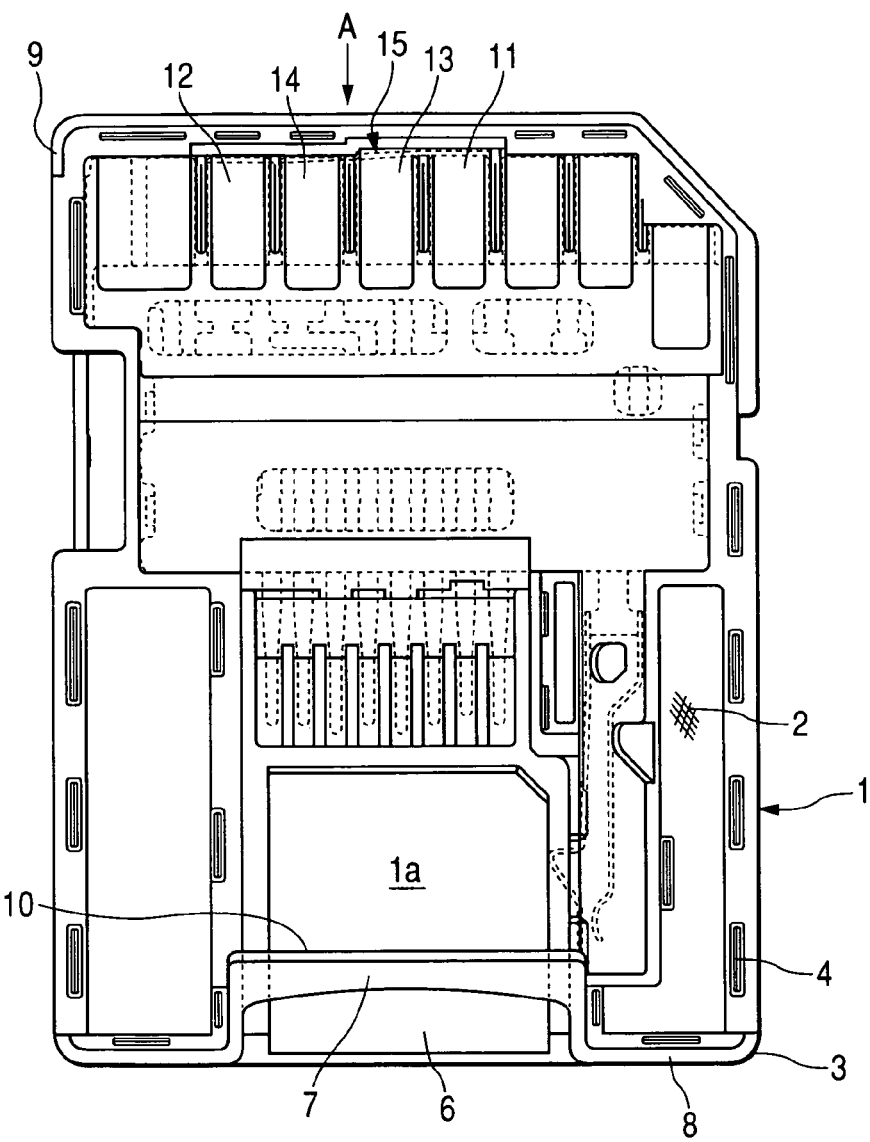
Figure 1B:
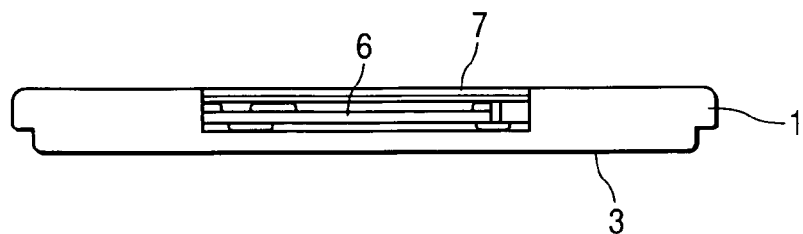
Figure 1C:
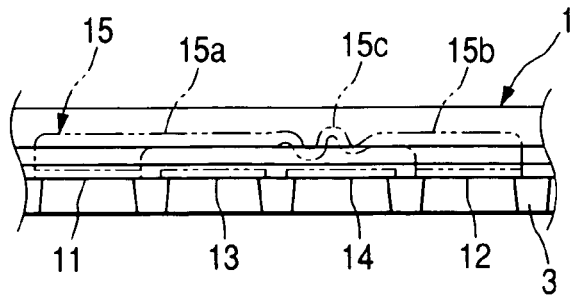
Figure 2A:
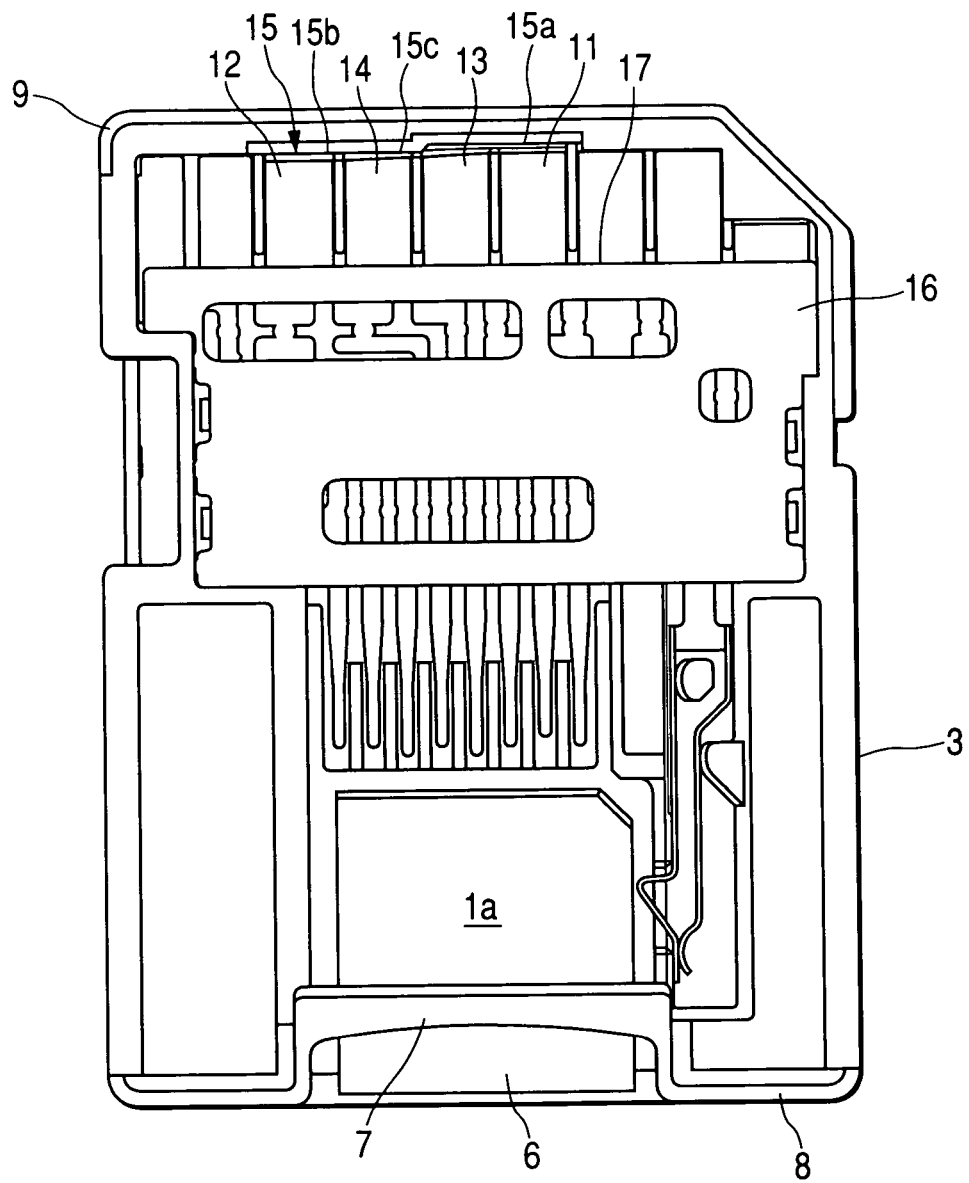
Figure 2B:
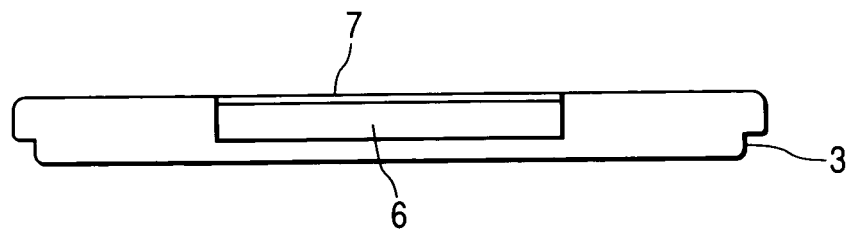
Figure 3:
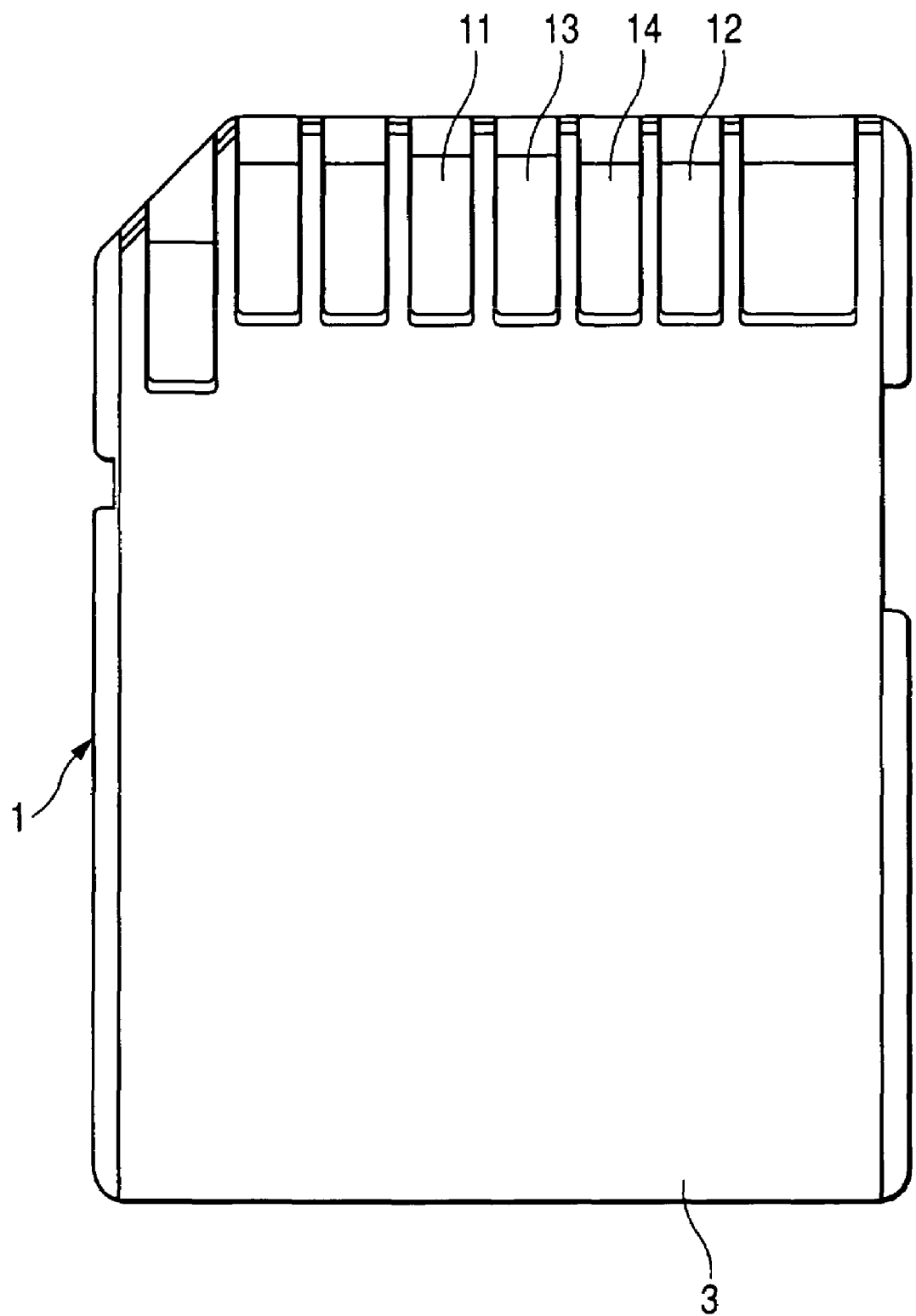
FIG. 3 is the bottom view of the present embodiment.
Figure 4:
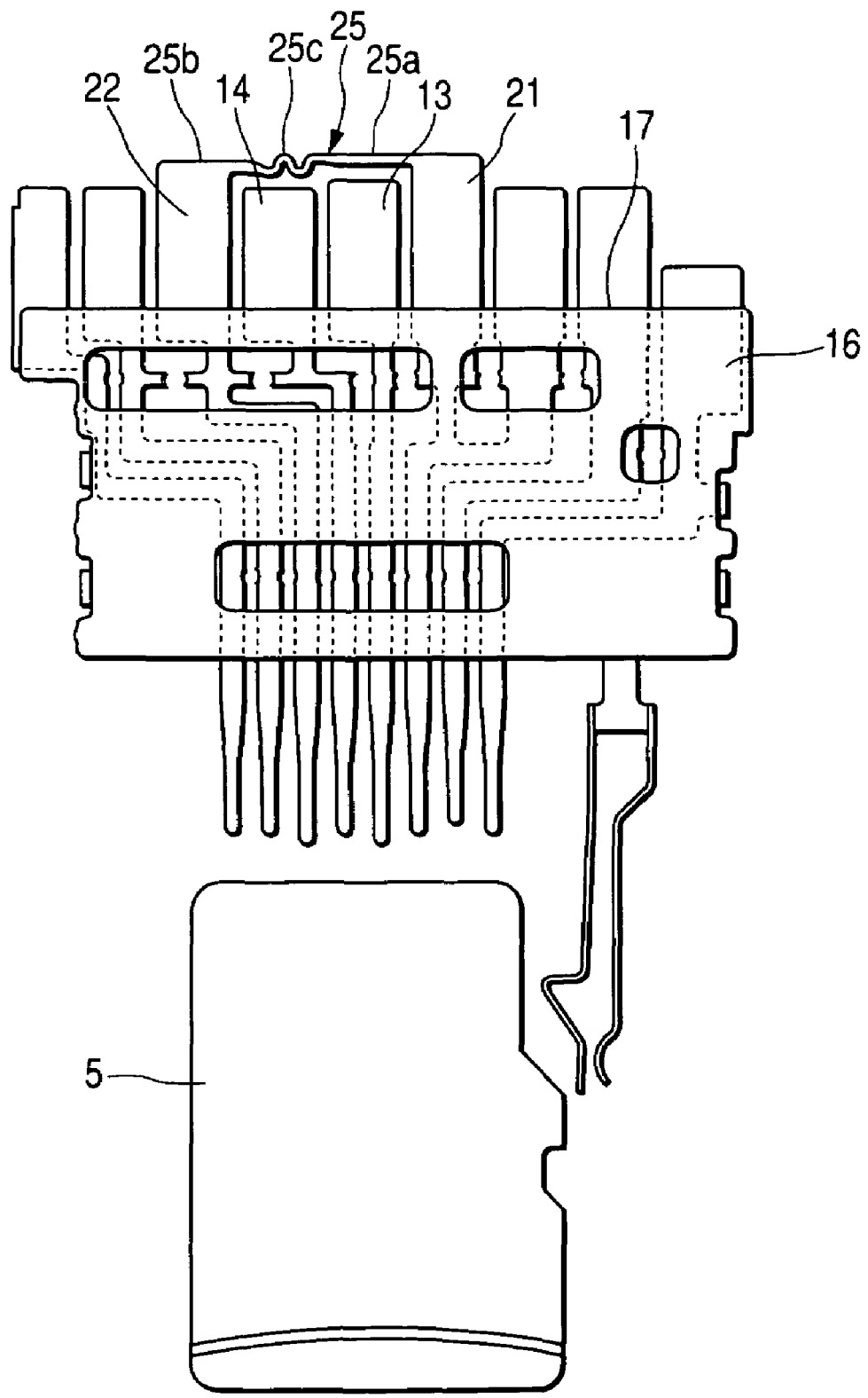
FIG. 4 is a plan view showing the process of manufacturing an external connecting part included in the present embodiment and shows a small card used in the present embodiment.

FIGS. 1A to 1C show an embodiment of a card adaptor according to the present invention, wherein FIG. 1A is a plan view of a portion of an upper case member, FIG. 1B is a front view thereof, and FIG. 1C is an enlarged view of a major part viewed at the direction A in FIG. 1A. FIGS. 2A and 2B show a lower case member included in the present embodiment, wherein FIG. 2A is a plan view thereof and FIG. 2B is a front view in a vicinity of the front end side. FIG. 3 is the bottom view of the present embodiment. FIG. 4 is a plan view showing the process of manufacturing an external connecting part included in the present embodiment and shows a small card used in the present embodiment.

In the present embodiment, as shown in FIG. 1A, a case 1 forming a main body comprises an upper case member 2 and a lower case member 3. The upper case member 2 and the lower case member 3 are engaged to each other, and an engaging part is provided with, for example, a plurality of coupling parts 4. The upper and lower case members 2 and 3 are integrally formed by melting and attaching them at the coupling part 4. A card mounting part 1a for mounting a card, for example, a small card 5 shown in FIG. 4 is formed at a space between the upper case member 2 and the lower case member 3. Also, a plurality of external connecting parts (not shown) are exposed at a bottom surface of a small card 5.

As shown in FIG. 1B, at a front end side of the case 1, an inserting groove 6 for inserting the small card 5 is provided. As shown in FIG. 2, in the vicinity of the inserting groove 6 of the lower case member 3, a card guide 7 for guiding a top surface of the small card 5 is formed. At the upper case member 2 at which the card guide 7 is not formed, a cut part is formed so as to be suitable for the card guide 7 to form an escaping part 10 for escaping from the card guide 7, as shown in FIG. 1A.

As shown in FIG. 2, the lower case member 3 is formed with a front wall 8 located at a front end side in a vicinity of the inserting groove 6 of the small card 5 and a rear wall 9 located at a rear end side of a longitudinal direction, and the upper case member 2 is positioned to be located between the front wall 8 and the rear wall 9 of the lower case member 3. That is, the upper case member 2 is located at the inside of the lower case member 3.

In addition, for example, as shown in FIG. 1B, a top surface of the upper case member 2, a top surface of the front wall 8 of the lower case member 3, a top surface of the rear wall 9, and a top surface of the card guide 7 are positioned at the same plane.

Furthermore, in the present embodiment, a plurality of external connecting parts connected to a connecting terminal of a card connector device (not shown) are provided at a rear end side at which the rear wall 9 is located. The external connecting part includes a first specific external connecting part 11 and a second specific external connecting part 12 short-circuited to each other, and, for example, two separate external connecting parts 13, 14 which are not short-circuited and are located between the first specific external connecting part 11 and the second specific external connecting part 12, as shown in FIGS. 1 and 2. The plurality of external connecting parts are supported by a resin member 16 formed by insert-molding, as shown in FIG. 2.

The above-mentioned first external connecting part 11 and the second external connecting part 12 are short-circuited by a short-circuit part 15 at each edge located at a rear end side of the lower case member 3. At a rear end side of the case 1, a length L1 from a predetermined reference line extending in parallel to the rear wall 9 of the lower case member 3 shown in FIG. 2, for example, the edge 17 of the resin member 16 to the edge of the first specific external connecting part 11 and the length L2 from the edge 17 to the edge of the second specific connecting part 12 are set to be different from each other. For example, the length L1 is set to be longer than the length L2, and thus, when performing connection to a card connector device (not shown), the first specific external connecting part 11 is connected to any of the plurality of connecting terminals of the card connector device, earlier than the second specific external connecting part 12.

The short-circuit part 15 for short-circuiting edge of the first specific external connecting part 11 and edge of the second specific external connecting part 12 includes a first rising part 15a extended in parallel along the rear wall 9 of the lower case member 3, a second rising part 15b positioned at the location spaced from the rear wall 9 compared to the first rising part 15a, and a curved part 15c formed at a boundary between the first rising part 15a and the second rising part 15b, as shown in FIGS. 2 and 1(c). Both the heights of the first rising part 15a and the second rising part 15b are set to be less than the thickness of the case 1.

In the process of manufacturing a plurality of external connecting parts, as shown in FIG. 4, a first external connecting part material 21 and a second external connecting part material 22 are integrally formed by short-circuit part material 25 including a first rising part material 25a, a second rising part material 25b and a curved part material 25c. In this condition, the upper side thereof is bent so that a length of the first specific external connecting part material 21 becomes L1 and a length of the second specific external connecting part material 22 becomes L2, thereby forming the short-circuit part 15 shown in FIG. 2.

In the present embodiment having the above-mentioned structure, when the small card 5 shown in FIG. 4 is inserted into the inserting groove 6 of the case 1 shown in FIG. 1 to be mounted in the card mounting part 1a, a plurality of external connecting parts (not shown) exposed at a bottom surface of the small card 5 are connected to corresponding external connecting parts of the present embodiment, respectively. As such, the small card 5 is mounted on the card connector device (not shown) in a state that the small card 5 is mounted in the card mounting part 1a, and thus the small card 5 and the card connector device are connected to each other, thereby performing transmission/reception of a signal between the small card 5 and the card connector device.

According to the present embodiment having the above-mentioned structure, if the small card 5 is distorted by a mistake when it is mounted in the card mounting part 1a, the card guide 7 of the lower case member 3 is subject to a force, and thus the force due to the distortion of the small card 5 is not delivered to the coupling part 4 between the upper case member 2 and the lower case member 3. Accordingly, the case 1 is prevented from being broken by separating the coupling part 4 by the force due to the distortion of the small card 5, and thus a strong card mounting structure can be accomplished and an excellent durability can be ensured.

Further, the upper case member 2 is formed with a cut part, that is, an escaping part 10 for escaping from the card guide 7 formed in the lower case member 3. Also, a top surface of the upper case member 2, a top surface of the front wall 8 of the lower case member 3, a top surface of the rear wall 9, and a top surface of the card guide 7 are positioned at the same plane. Accordingly, the thickness of the case 1 can be decreased and the case can be thinner.

In addition, since the upper case member 2 is positioned between the front wall 8 and the rear wall 9 of the lower case member 3, the upper case member 2 is not protruded from the lower case member 3 to the outside in the front and rear directions of the paper of FIG. 1A along the longitudinal direction of the lower case member 3, and thus the length of the product can be determined when manufacturing the lower case member 3. Accordingly, by precisely manufacturing the lower case member 3, deviation of a length of a product can be prevented to contribute to improvement of a yield.

Also, in the present embodiment, a short-circuit part 15 is comprised that short-circuit the edges of the first specific external connecting part 11 and the second specific external connecting part 12, with two separate external connecting parts 13, 14 not short-circuited inserted into the short-circuit part 15. The short-circuit part 15 can be integrally formed simultaneously with the first specific external connecting part 11 and the second specific external connecting part 12 in the process of manufacturing the external connecting part. Accordingly, the first specific external connecting part 11 and the second specific external connecting part 12 can be short-circuited by the short-circuit part 15, without increasing the number of parts and mounting work, thereby suppressing a manufacturing cost thereof.

In addition, since the short-circuit part 15 is formed by upward bending process in a state shown in FIG. 4, a longitudinal dimension of the case 1 is set to be short and the miniaturization of the longitudinal dimension can be accomplished.

Furthermore, since the curved part 15c is formed at the short-circuit part 15, variation of the short-circuit part 15 caused by a relationship with the short-circuit part 15 for connecting the first specific external connecting part 11 and the second specific external connecting part 12 by the bending process and different lengths L1, L2 from the edge 17 of the resin member 16 can be absorbed into variation of the curved part 15c, as shown in FIG. 2. Accordingly, as mentioned above, the first rising part 15a and the second rising part 15b of the short-circuit part 15 can be extended in parallel to the rear wall 9 of the lower case member 3, and thus a stable structure of the external connecting part with respect to the case 1 can be ensured.

Also, although the lower case member 3 of the case 1 is formed with the card guide 7 for guiding the top surface of the small card 5 in the above-mentioned embodiment, the upper case member 2 may be formed with a card guide for guiding the bottom surface of the small card 5. In the present embodiment, since the small card 5 is inserted into the inserting groove 6 of the case 1 in a state that the top surface is an upper side shown in FIG. 4 and the bottom surface a lower side, the card guide 7 of the lower case member 3 guides the top surface of the small card 5. But, in the case that the small card 5 is inserted in a state that the bottom surface is directed to an upper side, the card guide 7 of the lower case member 3 may guide the bottom surface of the small card 5. Similarly, in the case that the card guide is formed at the upper case member 2 and the small card 5 is inserted in a state that the bottom surface is directed to an upper side, the card guide formed at the upper case member 2 guides the top surface of the small card 5.

In addition, although the above-mentioned structure is that the front wall 8 and the rear wall 9 are formed at the lower case member 3 and the upper case member 2 is positioned between the front wall 8 and the rear wall 9, to the contrary, a structure may be employed that the front wall and the rear wall are formed at the upper case member, the lower case member is positioned between the front wall and the rear wall, and the upper case member and the lower case member are engaged to each other.

Moreover, although the short-circuit part 15 is formed by upward bending process, the short-circuit part 15 may be formed by downward bending process in the case that there is a margin at the downward portion.

Further, in the case that there is a margin at the vicinity of the rear wall 9 of the lower case member 3, the short-circuit part 15 may be positioned at the case 1 in the state shown in FIG. 4, without being bented.

Also, although the two separate external connecting parts 13, 14 which are not short-circuited are positioned between the first specific external connecting part 11 and the second specific external connecting part 12 in the above-mentioned embodiment, only one external connecting part or at least three external connecting parts which are not short-circuited may be positioned between the first specific external connecting part 11 and the second specific external connecting part 12.

Moreover, although only a set of the first specific external connecting part 11 and the second specific external connecting part 12 is formed in the above-mentioned embodiment, a plurality of sets of the specific external connecting parts may be formed.

What is claimed is:

1. A card adaptor comprising:
   a plurality of external connecting parts provided in parallel to each other in a case having a card mounting part for mounting a card,
   wherein external connecting parts provided on the card are connected to corresponding ones of the external connecting parts provided in the case, and the external connecting parts provided in the case are connected to corresponding ones of a plurality of connecting terminals of a card connector device,
   a plurality of the external connecting parts provided in the case are specific external connecting parts, and at least one of the external connecting parts provided in the case, which is not the specific external connecting part, is disposed in parallel between the plurality of specific external connecting parts; and
   a short-circuit part for short-circuiting edges of the specific external connecting parts is integrally formed with the specific external connecting parts.

2. The card adaptor according to claim 1,
   wherein the short-circuit part is formed by upward or downward bending process.

3. The card adaptor according to claim 2,
   wherein lengths from a predetermined reference line extending in parallel to a rear end of a case to the edge of each of the specific external connecting parts are set to be different from each other, and the short-circuit part is formed with a curved part.

4. The card adaptor according to claim 1,
   wherein the case includes
   an upper case member and a lower case member engaged to each other and the card mounting part is formed at a space between the upper case member and the lower case member, and
   a card guide for guiding either a top surface or a bottom surface of a card mounted in the card mounting part to either the upper case member or the lower case member.

5. The card adaptor according to claim 4,
   wherein an escaping part for escaping from the card guide is formed at either the upper case member or the lower case member in which the card guide is not comprised.

6. The card adaptor according to claim 4,
   wherein a front wall located at a front end side in a vicinity of an inserting groove of the card and a rear wall located at a rear end side thereof are formed at either the upper case member or the lower case member, and the other of the upper case member and the lower ease member is positioned between the front wall and the rear wall.

7. The card adaptor according to claim 1,
   wherein the short-circuit part includes a first rising part and a second rising part, and a curved part is formed between the first rising part and the second rising part.

8. The card adaptor according to claim 1,
   wherein the case includes an upper case member and a lower case member engaged to each other, and the card mounting part is formed at a space between the upper case member and the lower case member,
   a front wall located at a front end side in a vicinity of an inserting groove of the card and a rear wall located at a rear end side thereof are formed at either the upper case member or the lower case member,
   the short-circuit part includes a first rising part and a second rising part, and the first rising part and the second rising part are fined by upward or downward bending process, and
   the first rising part and the second rising part extend in parallel along the rear wall.

* * * * *